United States Patent
Copel et al.

(10) Patent No.: US 10,833,270 B1
(45) Date of Patent: Nov. 10, 2020

(54) LATERAL ELECTROCHEMICAL CELL WITH SYMMETRIC RESPONSE FOR NEUROMORPHIC COMPUTING

(71) Applicant: INTERNATIONAL BUSINESS MACHINES CORPORATION, Armonk, NY (US)

(72) Inventors: Matthew W. Copel, Yorktown Heights, NY (US); Takashi Ando, Tuckahoe, NY (US); Ko-Tao Lee, Yorktown Heights, NY (US); John Rozen, Hastings on Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/405,322

(22) Filed: May 7, 2019

(51) Int. Cl.
*H01L 45/00* (2006.01)

(52) U.S. Cl.
CPC .......... *H01L 45/1683* (2013.01); *H01L 45/08* (2013.01); *H01L 45/1206* (2013.01); *H01L 45/1226* (2013.01); *H01L 45/1266* (2013.01); *H01L 45/14* (2013.01); *H01L 45/145* (2013.01); *H01L 45/147* (2013.01)

(58) Field of Classification Search
CPC . H01L 45/08; H01L 45/1206; H01L 45/1226; H01L 45/1266; H01L 45/14; H01L 45/145; H01L 45/147; H01L 45/1683
See application file for complete search history.

(56) References Cited

U.S. PATENT DOCUMENTS

| | | | |
|---|---|---|---|
| 7,658,773 B2 | 2/2010 | Pinnow | |
| 8,058,643 B2 | 11/2011 | Meyer et al. | |
| 8,198,619 B2 * | 6/2012 | Lee | H01L 45/085 257/4 |
| 8,242,478 B2 | 8/2012 | Sakamoto | |
| 8,531,006 B2 | 9/2013 | Chen | |
| 8,705,265 B2 | 4/2014 | Strukov et al. | |
| 10,079,341 B1 | 9/2018 | Bedell et al. | |
| 2008/0001137 A1 * | 1/2008 | Kozicki | G11C 11/5614 257/4 |
| 2009/0020742 A1 * | 1/2009 | Sunamura | H01L 45/1675 257/4 |
| 2015/0079481 A1 | 3/2015 | Sun et al. | |

(Continued)

FOREIGN PATENT DOCUMENTS

WO WO 2015199706 A1 12/2015

OTHER PUBLICATIONS

Tang et al., "ECRAM as Scalable Synaptic Cell for High-Speed, Low-Power Neuromorphic Computing", 2018 IEEE International Electron Devices Meeting (IEDM), Dec. 2018, 4 pages.

(Continued)

*Primary Examiner* — Allan R Wilson
(74) *Attorney, Agent, or Firm* — Tutunjian & Bitetto, P.C.; Randall Bluestone (57) ABSTRACT

A method of forming a resistive processing unit is provided. The method includes forming a spacer on a substrate. The method further includes forming an intercalation layer segment on opposite sides of the spacer, and replacing a portion of each of the intercalation layer segments with an insulating region. The method further includes replacing the spacer with an electrolyte layer.

14 Claims, 10 Drawing Sheets

(56) References Cited

U.S. PATENT DOCUMENTS

2015/0263280 A1* 9/2015 Miyazaki ............... H01L 45/08
 257/4
2015/0340609 A1 11/2015 Banno et al.
2018/0205089 A1* 7/2018 Unnikrishnan ......... H01M 6/40

OTHER PUBLICATIONS

Mai et al., "Memristive and Neuromorphic Behavior in a LixCoO2 Nanobattery", Scientific Reports, Jan. 2015, pp. 1-6.
Yang et al., "All-Solid-State Synaptic Transistor with Ultralow Conductance for Neuromorphic Computing", Advanced Functional Materials, Synaptic Electronics, Sep. 2018, pp. 1-10.
Wang et al., "Memristors with Diffusive Dynamics as Synaptic Emulators for Neuromorphic Momputing", Nature Materials, Jan. 2017, pp. 101-110, vol. 16.

* cited by examiner

LATERAL ELECTROCHEMICAL CELL WITH SYMMETRIC RESPONSE FOR NEUROMORPHIC COMPUTING

BACKGROUND

The present invention generally relates to resistive processing units (RPUs), and more particularly to resistive processing units using electrochemical cells.

Resistive processing units (RPUs) are analog devices that can attain a resistance value through repeated pattern recognition. The RPUs can be trained using a data set to establish weights (resistance values) for each of the resistive processing units by receiving analog inputs in the form of voltages. The RPUs can be building blocks for neuromorphic computing systems, where the analog devices can provide fast and efficient processing, since information is stored by the resistance values of the RPUs.

SUMMARY

In accordance with an embodiment of the present invention, a method of forming a resistive processing unit is provided. The method includes forming a spacer on a substrate. The method further includes forming an intercalation layer segment on opposite sides of the spacer, and replacing a portion of each of the intercalation layer segments with an insulating region. The method further includes replacing the spacer with an electrolyte layer.

In accordance with another embodiment of the present invention, a method of forming a resistive processing unit (RPU) is provided. The method includes forming a plurality of lower conductive lines on an insulating region. The method further includes forming a lower insulating layer over the plurality of lower conductive lines, and forming a via to each of the plurality of lower conductive lines. The method further includes forming a plurality of spacers on the lower insulating layer, wherein each of the plurality of spacers is offset from one of the vias. The method further includes forming intercalation layer segments on the insulating layer; wherein the intercalation layer segments are on opposite sides of each of the plurality of spacers, and replacing a portion of each intercalation layer segments with an insulating region. The method further includes replacing each of the plurality of spacers with an electrolyte layer.

In accordance with yet another embodiment of the present invention, a resistive processing unit (RPU) is provided. The RPU includes an electrolyte layer on a substrate, and an intercalation layer segment on opposite sides of the electrolyte layer. The RPU further includes an upper insulating layer on the electrolyte layer, insulating regions, and intercalation layer segments.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a lateral electrochemical cell with a symmetric response for neuromorphic computing, where the electrochemical cell includes a channel, an electrolyte, and a gate. The gate can be a layered solid-state structure, with a reservoir in contact with the electrolyte, and a conductive metal contact above the reservoir, but not contacting the electrolyte. The channel is made from a material that can change conductivity with the addition or removal of an intercalant, where the intercalant is a charge carrier. An intercalant can be molecule or ion inserted into materials with layered structures for example, hydrogen (H), a main group metal (e.g., lithium (Li), sodium (Na), calcium (Ca)) or transition metal (e.g., titanium (Ti), tungsten (W), ruthenium (Ru), osmium (Os)) inserted into a transition metal oxide or graphite structure or included as a layered metal dichalcogenide. Lithiated metal oxides are of particular interest as a host material. The intercalation can involve charge transfer between a guest and a host solid. If the reservoir and the channel have much different affinities for the intercalant, a large voltage can be required to drive the intercalant in and/or out of the channel, whereas having a channel and a reservoir with very similar affinities for the intercalant can allow lower voltages to add or remove the intercalant form the channel. Unlike in a battery, a symmetric electrochemical cell can use lower power to change the cells resistivity (i.e., program it).

Embodiments of the present invention provide an array of electrochemical cells integrated into a resistive processing unit (RPU), where each of the electrochemical cells can provide programmable storage with a low-voltage response.

Embodiments of the present invention provide a method of forming a three-terminal electrochemical cell having symmetric responses. Due to the thermal processes involved in constructing layered electrochemical devices, the channel and reservoir can have similar compositions, but different electrical properties due to the different thermal histories. A lateral electrochemical structure can have the channel and reservoir deposited on the same region of the substrate, with an intervening gap for the electrolyte. Thus, both elements are in contact with the substrate, rather than being stacked vertically. This allows both the channel and reservoir to undergo the same processing steps and environment to provide electrical equivalence (e.g., symmetry).

Embodiments of the present invention provide a method of detecting conductivity across a channel of an electrochemical cell by measuring sense and voltage contacts to the channel.

Exemplary applications/uses to which the present invention can be applied include, but are not limited to: resistive processing units (RPUs) and neuromorphic computing systems.

It is to be understood that aspects of the present invention will be described in terms of a given illustrative architecture; however, other architectures, structures, substrate materials and process features and steps can be varied within the scope of aspects of the present invention.

Figure 1:
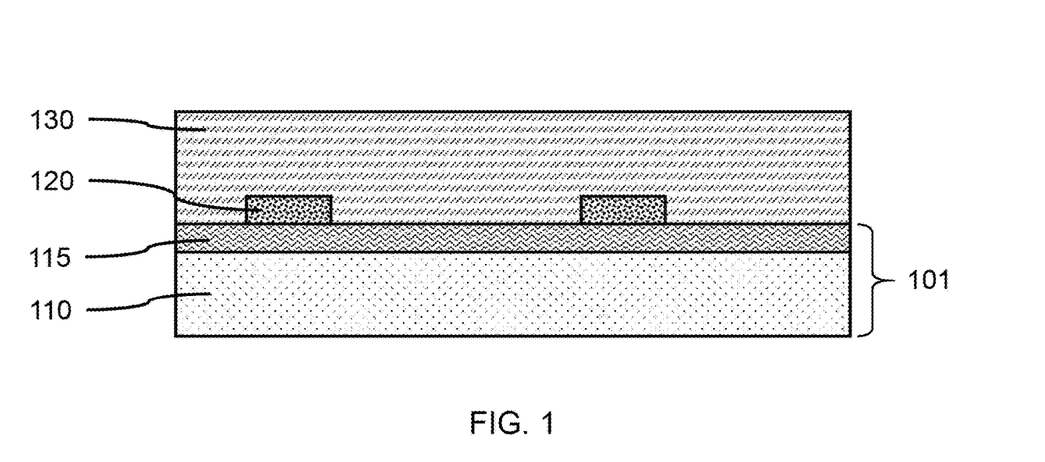
FIG. 1 is a cross-sectional side view showing a plurality of conductive lines on a substrate, and a lower insulating layer over the conductive lines, in accordance with an embodiment of the present invention.

Referring now to the drawings in which like numerals represent the same or similar elements and initially to FIG. 1, a cross-sectional side view of a plurality of conductive lines on a substrate, and a lower insulating layer over the conductive lines, is shown, in accordance with an embodiment of the present invention.

In one or more embodiments, a plurality of lower conductive lines 120 can be formed on a substrate 101, where the substrate can include an insulating region 115 and a semiconductor region 110. In various embodiments, the substrate 101 can be a semiconductor-on-insulator (SEOI) structure, for example, a silicon-on-insulator (SOI) structure or silicon-germanium-on-insulator (SGOI) structure. In various embodiments, substrate 101 can be a semiconductor wafer with an insulating region 115 formed on the surface of a semiconductor region 110, where the semiconductor region 110 can be the semiconductor wafer and the insulating region 115 can be a buried oxide (BOX) layer. The semiconductor region 110 can be a semiconductor, including, but not limited to, a type IV semiconductor (e.g., silicon (Si), germanium (Ge)), a type IV-IV semiconductor (e.g., silicon-germanium (SiGe), silicon carbide (SiC)), a III-V semiconductor (e.g., gallium arsenide (GaAs), indium phosphide (InP), indium-gallium arsenide (InGaAs), a II-VI semiconductor (e.g., cadmium telluride (CdTe), zinc selenide (ZnSe)), where the semiconductor can be single crystal.

In various embodiments, the insulating region 115 can be an oxide of the semiconductor region material, for example, silicon oxide (SiO), where the oxide can be a native oxide, a thermal oxide, a buried oxide (BOX) layer, a deposited oxide (e.g., by chemical vapor deposition (CVD)), or a combination thereof. In various embodiments, the insulating region 115 can be an insulating material other than an oxide of the semiconductor region material, for example, a nitride (e.g., SiN), and oxynitride (e.g., SiON), a carbonitride (e.g., SiCN), a boronitride (e.g., SiBN), a boro carbonitride ((e.g., SiBCN), or an oxide of a different semiconductor material, for example, SiO on a III-V semiconductor region 110, or a combination thereof.

In various embodiments, the semiconductor region 110 can include previously fabricated active and/or passive electronic devices, for example, transistors, capacitors, inductors, etc.

In various embodiments, the lower conductive lines 120 can be made of a metal (e.g., tungsten (W), tantalum (Ta), ruthenium (Ru), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), tantalum magnesium carbide (TaMgC), carbon nanotubes (CNT), conductive carbon, graphene, or any suitable combination of these materials.

In various embodiments, the lower conductive lines 120 can be made by a blanket deposition (e.g., chemical vapor deposition (CVD), plasma enhanced CVD (PECVD), physical vapor deposition (PVD), and a suitable patterning by lithography and etch-back (e.g., by reactive ion etching (RIE).

In one or more embodiments, a lower insulating layer 130 can be formed over the lower conductive lines 120, where the lower insulating layer 130 can be formed by a blanket deposition, including, but not limited to, chemical vapor deposition (CVD), plasma enhanced CVD (PECVD), spin-on processes, or a combination thereof. The lower insulating layer 130 can be an insulating dielectric material, including, but not limited to silicon oxide (SiO), silicon nitride (SiN), silicon oxynitride (SiON), or a low-k dielectric.

Figure 2:
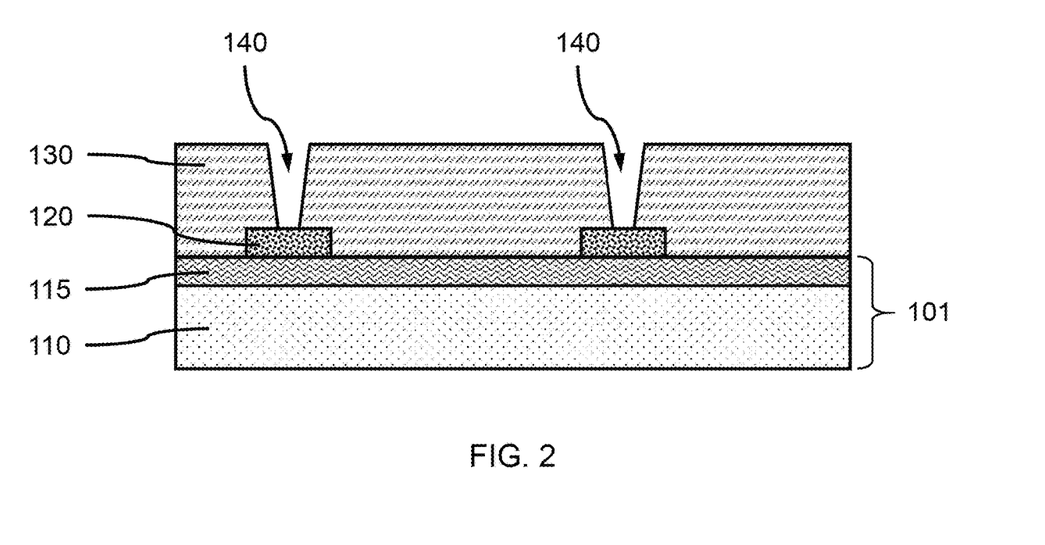
FIG. 2 is a cross-sectional side view showing a plurality of trenches through the insulating layer to the lower conductive lines, in accordance with an embodiment of the present invention.

FIG. 2 is a cross-sectional side view showing a plurality of trenches through the insulating layer to the lower conductive lines, in accordance with an embodiment of the present invention.

In one or more embodiments, a lower trench 140 can be formed through the lower insulating layer 130 to each of the lower conductive lines 120, where the trench 140 can form a via. The lower trench 140 can be formed by masking the lower insulating layer 130 with a resist, patterning the resist by lithography, and etching the lower trench 140 using a reactive ion etch (RIE). The locations of the lower trenches can coincide with the locations of subsequently formed intercalation layer segments.

Figure 3:
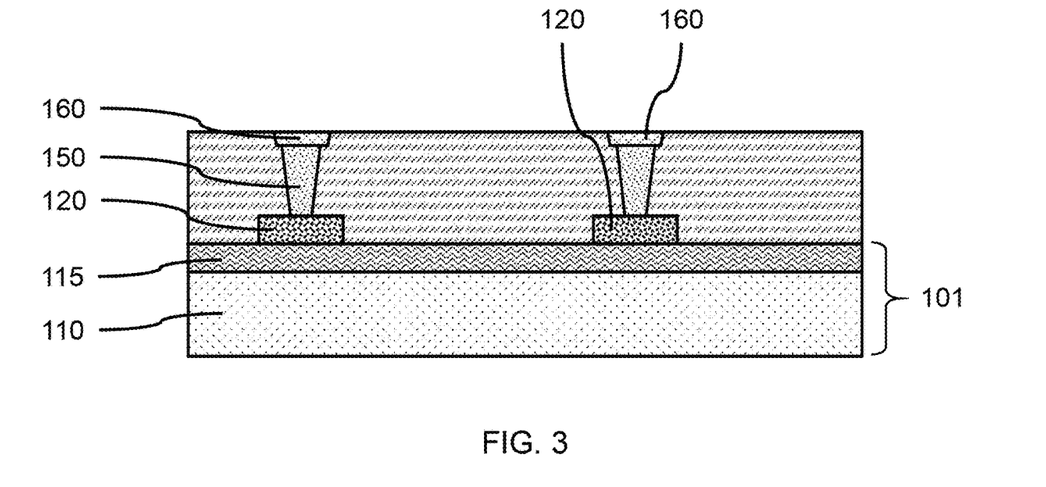
FIG. 3 is a cross-sectional side view showing a conductive fill formed in each of the trenches to form sense line contacts to the lower conductive lines, and a barrier layer formed on the conductive fill, in accordance with an embodiment of the present invention.

FIG. 3 is a cross-sectional side view showing a conductive fill formed in each of the trenches to form sense line contacts to the lower conductive lines, and a barrier layer formed on the conductive fill, in accordance with an embodiment of the present invention.

In one or more embodiments, the lower trench(es) 140 can be filled with a conductive material to form a via 150, where the conductive material can include, but not limited to, a metal (e.g., tungsten (W), tantalum (Ta), ruthenium (Ru), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), tantalum magnesium carbide (TaMgC), carbon nanotubes (CNT), conductive carbon, graphene, or any suitable combination of these materials.

In one or more embodiments, a portion of the lower insulating layer 130 and via 150 can be removed to form an indentation over the via 150, and the indentation filled with a barrier layer 160. In various embodiments, the barrier layer 160 can be tantalum nitride (TaN), tantalum carbide (TaC), titanium nitride (TiN), titanium carbide (TiC), tantalum-titanium alloys (TaTi), or a combination thereof. In various embodiments, the barrier layer 160 can be sufficiently thick to prevent diffusion of the conductive material forming the via(s) 150 into an overlying layer of an intercalation material. In various embodiments, the barrier layer can have a thickness in a range of about 5 nm to about 20 nm, or about 10 nm to about 15 nm, where the barrier layer can be sufficiently thick to prevent diffusion of the other materials.

Figure 4:
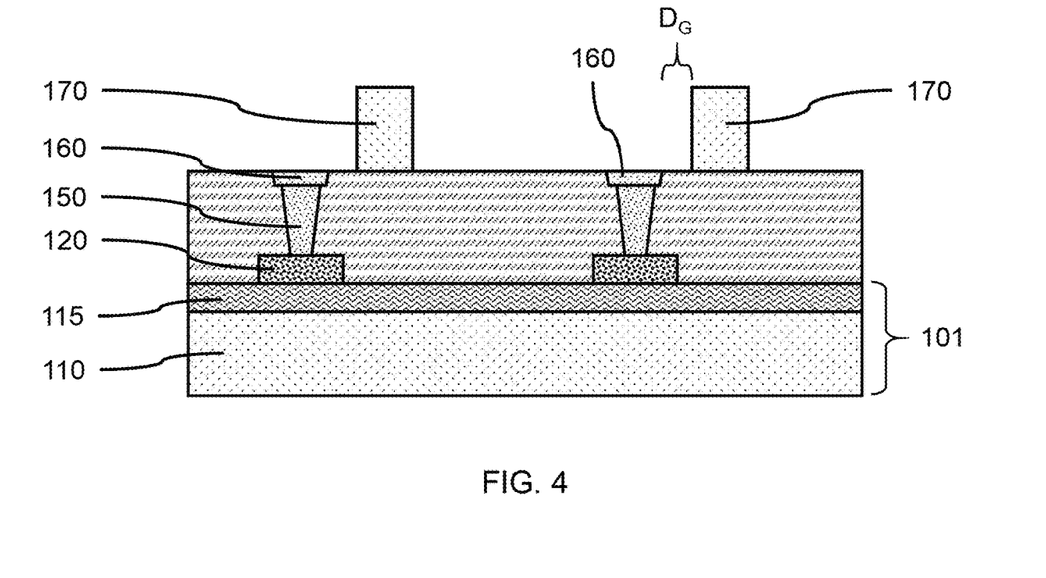
FIG. 4 is a cross-sectional side view showing a plurality of spacers formed on the insulating layer, in accordance with an embodiment of the present invention.

FIG. 4 is a cross-sectional side view showing a plurality of spacers formed on the insulating layer, in accordance with an embodiment of the present invention.

In one or more embodiments, one or more spacers 170 can be formed on the lower insulating layer 130, where the spacers 170 are not formed over the vias 150. The one or more spacers 170 can be formed by depositing a spacer layer over the lower insulating layer 130 and vias 150, and removing portions of the spacer layer using lithography and etching (e.g., RIE). Each spacer 170 can be adjacent to a via 150 and barrier layer 160, where the spacer is separated from the via 150 by a gap distance, DG. In various embodiments, the gap distance, DG, can be in a range of about 1 nanometer (nm) to about 100 nm, or about 10 nm to about 50 nm, or about 15 nm to about 25 nm, where the gap distance can be sufficient to have a portion of an overlying intercalation layer segment between the via 150 and a subsequently formed electrolyte layer.

In various embodiments, the one or more spacers 170 can be made of a sacrificial material that can be easily removed without damaging or etching the underlying and surrounding materials, for example, a photoresist material, amorphous silicon (a-Si), germanium (Ge), or a combination thereof.

Figure 5:
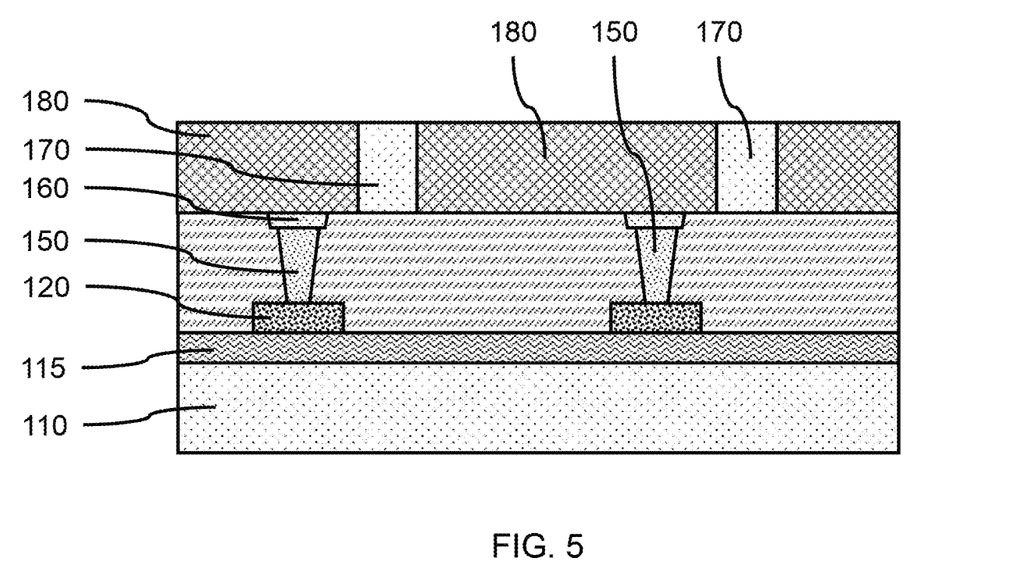
FIG. 5 is a cross-sectional side view showing intercalation layer segments formed on the insulating layer adjoining the plurality of spacers, in accordance with an embodiment of the present invention.

FIG. 5 is a cross-sectional side view showing intercalation layer segments formed on the insulating layer adjoining the plurality of spacers, in accordance with an embodiment of the present invention.

In one or more embodiments, an intercalation layer can be formed on the insulating layer 130 and barrier layer 160, where the intercalation layer is adjoining each of the plurality of spacers 170. The intercalation layer can be formed by atomic layer deposition (ALD), chemical vapor deposition (CVD), physical vapor deposition (PVD), for example, sputtering, or a combination thereof, where the intercalation layer covers the sidewalls of the spacers 170. Portions of the intercalation layer deposited on the exposed top surfaces of the spacers 170 can be removed using a chemical-mechanical polishing (CMP) and/or an isotropic etch, for example, a wet chemical etch or dry plasma etch, to form intercalation layer segments 180 on opposite sides of each spacer 170, where the top surface of the intercalation layer segments 180 can be coplanar with the top surfaces of the spacers 170. The spacers 170 can separate an intercalation layer segment 180 forming a channel portion from another intercalation layer segment 180 forming a reservoir portion of a device. Source/drain contacts can be provided to the channel side, whereas a gate contact can be provided on the reservoir side to control the charge carrier concentration of the channel. An electrolyte can provide a migration region for an intercalant between the channel and reservoir.

In one or more embodiments, the intercalation layer segments 180 can be a layered material, including, but not limited to, graphite (C) having a hexagonal crystal structure with a $P6_{3mc}$ or $P6_3/mmc$ space group, or a metal oxide, for example, lithium cobalt (III) oxide ($LiCoO_2$), sodium cobalt (III) oxide ($NaCoO_2$), lithium titanium dioxide ($LiTiO_2$), tungsten oxide (WO), niobium oxide (NbO), lithium vanadium pentoxide ($LiV_2O_5$), lithium iron oxide (LiFeO), Lithium manganese-cobalt dioxide ($LiMnCoO_2$), nickel-manganese-cobalt dioxide ($NiMnCoO_2$), lithium nickel-cobalt-aluminum dioxide ($LiNiCoAlO_2$), or lithium iron phosphate ($LiFePO_4$). In various embodiments, the intercalation layer segments can include graphite (C), cobalt dioxide ($CoO_2$), titanium dioxide ($TiO_2$), tungsten oxide (WO), niobium oxide (NbO), vanadium pentoxide ($V_2O_5$), iron oxide (FeO), manganese-cobalt dioxide ($MnCoO_2$), nickel-manganese-cobalt dioxide ($NiMnCoO_2$), nickel-cobalt-aluminum dioxide ($NiCoAlO_2$), or iron phosphate ($FePO_4$). In various embodiments, the intercalated element can be hydrogen (H), a main group metal, including, but not limited to, lithium (Li), sodium (Na), calcium (Ca), or a combination thereof. For example, with lithium containing compounds, de-intercalation of lithium to form a lithium-deficient film reduces the conductivity. For the metal oxides (e.g., $WO_3$, NbO, etc.), the addition or removal of the intercalant can change the conductivity/resistivity of the compound by at least one order of magnitude (i.e., ×10). The amount of intercalant included in the intercalation layer segment 180 can be sufficient to alter the conductivity/resistivity of the intercalation layer segment without creating a new compound, for example, by changing the crystal structure or chemical bonding.

In various embodiments, the intercalation layer segments 180 can form a reservoir and a channel for the electrochemical cell of an RPU.

In various embodiments, the intercalation layer segments 180 and spacers 170 can have a thickness in a range of about 10 nm to about 200 nm, or about 40 nm to about 80 nm, although other thicknesses are also contemplated, where the thickness of the intercalation layer segments 180 is sufficient to completely cover the side of the sacrificial spacers 170, where the thickness of sacrificial spacers 170 can be dictated by mechanical stability and lithography constraints.

In one or more embodiments, the intercalation layer segments 180 can be heat treated at a temperature in a range of about 200° C. to about 700° C., or about 350° C. to about 650° C., to anneal the intercalation layer segments 180 and evolve a microstructure that allows faster diffusion of intercalants, and improves the material lifetime through multiple cycles (e.g., hysteresis). The intercalation layer segments 180 on opposite sides of the spacers 170 can be heat treated at the same time.

Figure 6:
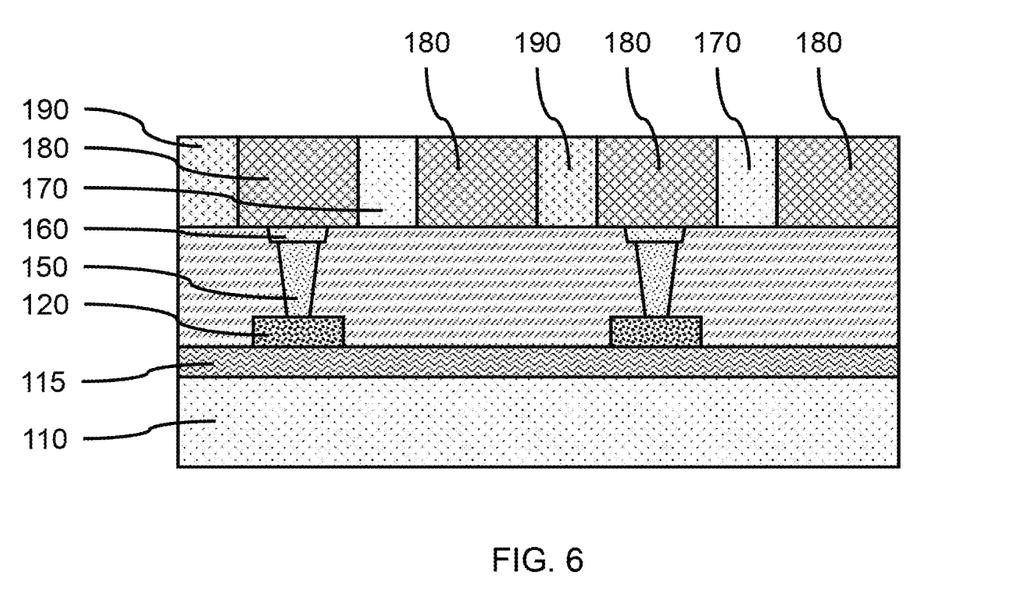
FIG. 6 is a cross-sectional side view showing portions of the intercalation layer segments replaced with isolation regions, in accordance with an embodiment of the present invention.

FIG. 6 is a cross-sectional side view showing portions of the intercalation layer segments replaced with isolation regions, in accordance with an embodiment of the present invention.

In one or more embodiments, portions of the intercalation layer segments 180 can be removed using lithography and etching (e.g., RIE) to form a recessed region that exposes the underlying lower insulating layer 130. The recessed region can be on the opposite side of the via 150 and barrier layer 160 from the spacer 170. An insulating region 190 can be formed in the recessed region by depositing an insulating dielectric material by a blanket deposition (e.g., CVD, PECVD, spin-on). The insulating region 190 can be made of insulating dielectric material, including, but not limited to, silicon oxide (SiO), silicon nitride (SiN), silicon oxynitride (SiON), a low-k dielectric material, or a combination thereof. A low-k dielectric material can be, for example, a fluoride doped silicon oxide (SiO:F), carbon doped silicon oxide (SiO:C), organo-silicate glass (OSG), hydrogen silsesquioxane (HSQ), and methylsilsesquioxane (MSQ). The insulating region 190 can provide electrical isolation for adjacent electrochemical cells.

In various embodiments, the portion of the intercalation layer segments 180 remaining between the spacer 170 and the insulating region 190 can have a width in a range of about 1 nm to about 100 nm, or about 10 nm to about 50 nm, or about 15 nm to about 25 nm, although other widths are also contemplated.

Figure 7:
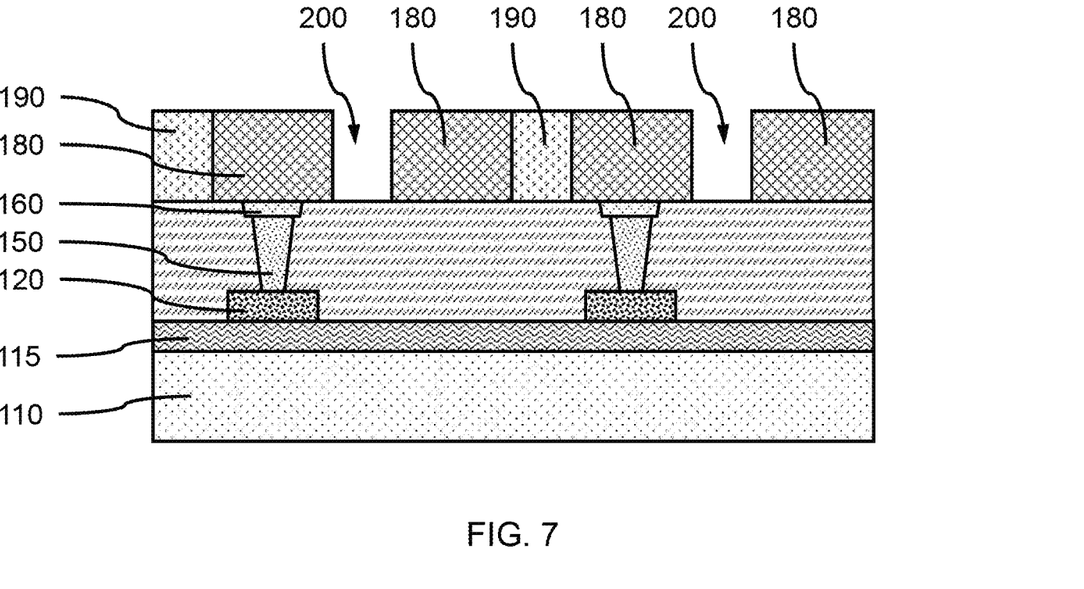
FIG. 7 is a cross-sectional side view showing the plurality of spacers removed to form opening disposed between the intercalation layer segments, in accordance with an embodiment of the present invention.

FIG. 7 is a cross-sectional side view showing the plurality of spacers removed to form opening disposed between the intercalation layer segments, in accordance with an embodiment of the present invention.

In one or more embodiments, the one or more spacers 170 can be removed to form opening(s) 200 in the intercalation layer segments 180, where the one or more spacers 170 can be removed using an isotropic etch. Removing the spacer 170 can form the opening 200 between two portions of the intercalation layer segments 180 having the same width, so the intercalation layer segments 180 are physically and/or electrically symmetric on either side of the opening 200.

Figure 8:
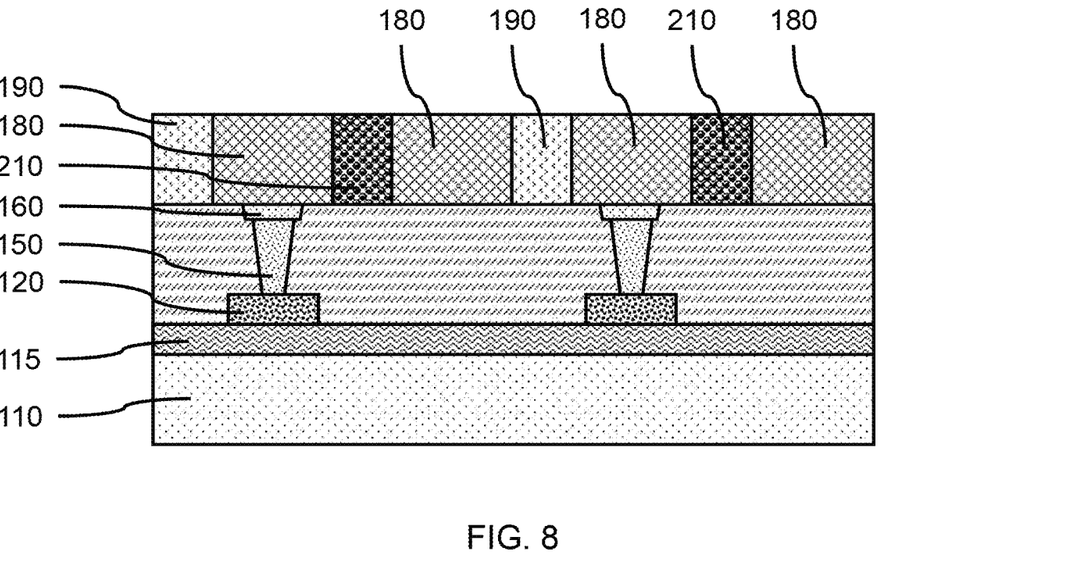
FIG. 8 is a cross-sectional side view showing an electrolyte layer formed in the plurality of openings between the intercalation layer segments, in accordance with an embodiment of the present invention.

FIG. 8 is a cross-sectional side view showing an electrolyte layer formed in the plurality of openings between the intercalation layer segments, in accordance with an embodiment of the present invention.

In one or more embodiments, an electrolyte layer 210 can be formed in the plurality of openings 200 between the symmetric portions of the intercalation layer segments 180. The electrolyte layer 210 can be formed by a spin-on process or PVD, there the electrolyte layer 210 can fill the openings 200. In various embodiments, excess electrolyte layer 210 can be removed from the top surfaces of the intercalation layer segments 180 and insulating regions 190 using CMP and/or isotropic etching. One of the two intercalation layer segments 180 can form a reservoir for the intercalant and the other of the intercalation layer segments 180 on the opposite side of the electrolyte layer 210 can form a device channel.

In one or more embodiments, the electrolyte layer 210 can be a solid electrolyte including a main group metal, including, but not limited to, LiPON, LiZrPO, $Li_2S$, or hydrogen electrolytes such as NAFION® (e.g., sulfonated tetrafluoroethylene based fluoropolymer-copolymers).

Figure 9:
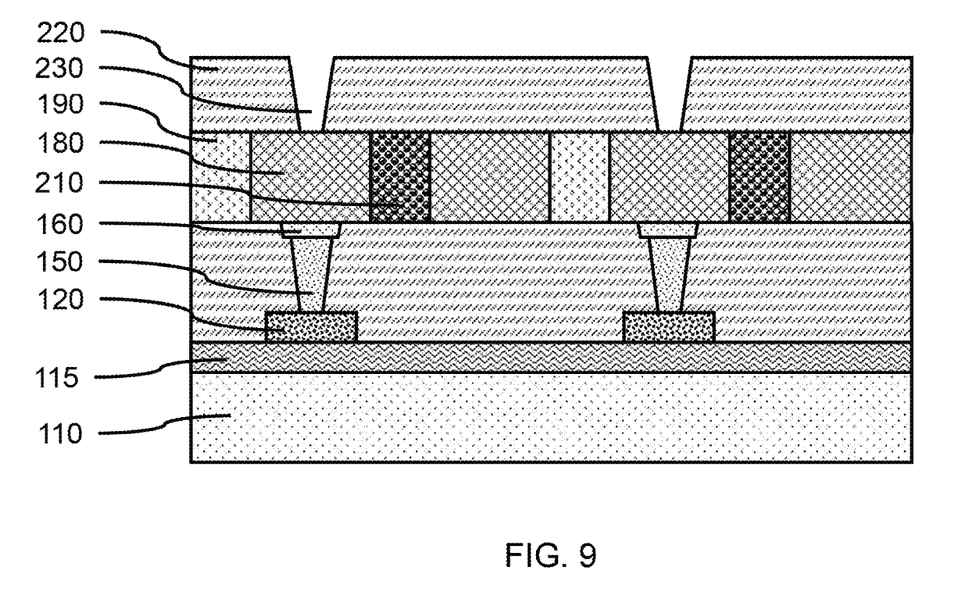
FIG. 9 is a cross-sectional side view showing an upper insulating layer on the electrolyte layer and intercalation layer segments with trenches through the upper insulating layer to the intercalation layer segments, in accordance with an embodiment of the present invention.

FIG. 9 is a cross-sectional side view showing an upper insulating layer on the electrolyte layer and intercalation layer segments with trenches through the upper insulating layer to the intercalation layer segments, in accordance with an embodiment of the present invention.

In one or more embodiments, an upper insulating layer 220 can be formed on the electrolyte layer 210 and intercalation layer segments 180, where the upper insulating layer 220 can be formed by a blanket deposition to cover the electrolyte layer 210, the intercalation layer segments 180, and insulating regions 190.

In one or more embodiments, upper trenches 230 can be formed in the upper insulating layer 220 to the portion of the intercalation layer segments 180 over the via 150 forming a sense line.

Figure 10:
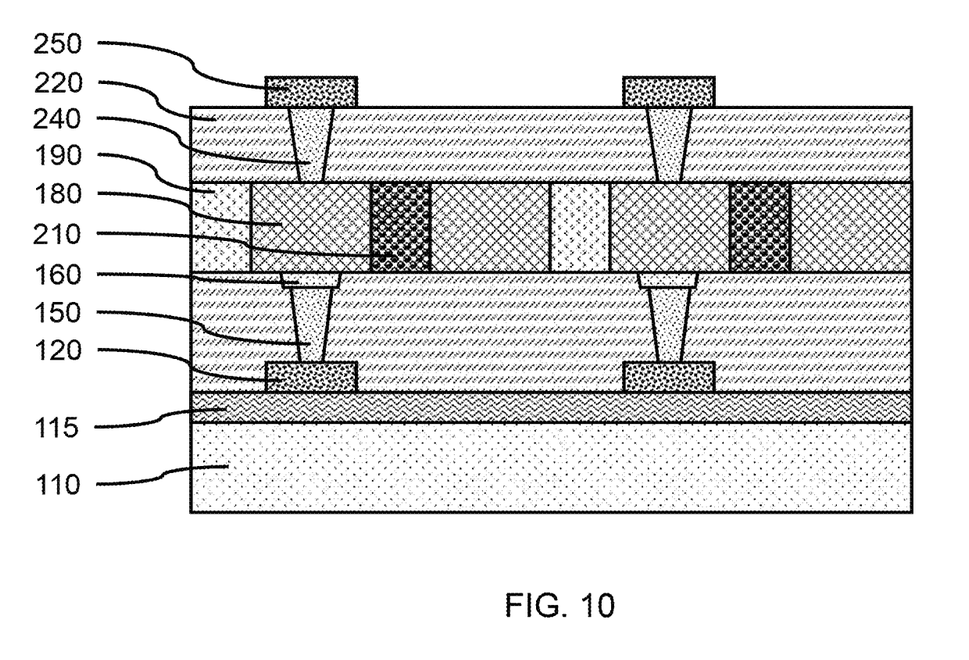
FIG. 10 is a cross-sectional side view showing a conductive fill formed in each of the trenches to the intercalation layer segments, and a conductive line on the conductive fills, in accordance with an embodiment of the present invention.

FIG. 10 is a cross-sectional side view showing a conductive fill formed in each of the trenches to the intercalation layer segments, and conductive line on the conductive fills, in accordance with an embodiment of the present invention.

In one or more embodiments, an upper conductive fill 240 can be formed in each of the upper trenches 230 to the intercalation layer segments 180 and an upper conductive lines 250 can be formed on the conductive fill 240 to form a bit line to the same portion of the intercalation layer segments 180 as the sense line formed by lower conductive lines 120. The upper conductive fill 240 and upper conductive lines 250 with the lower conductive lines 120 and via 150 can form the source/drain contacts to the device channel formed by the intercalation layer segments 180.

Figure 11:
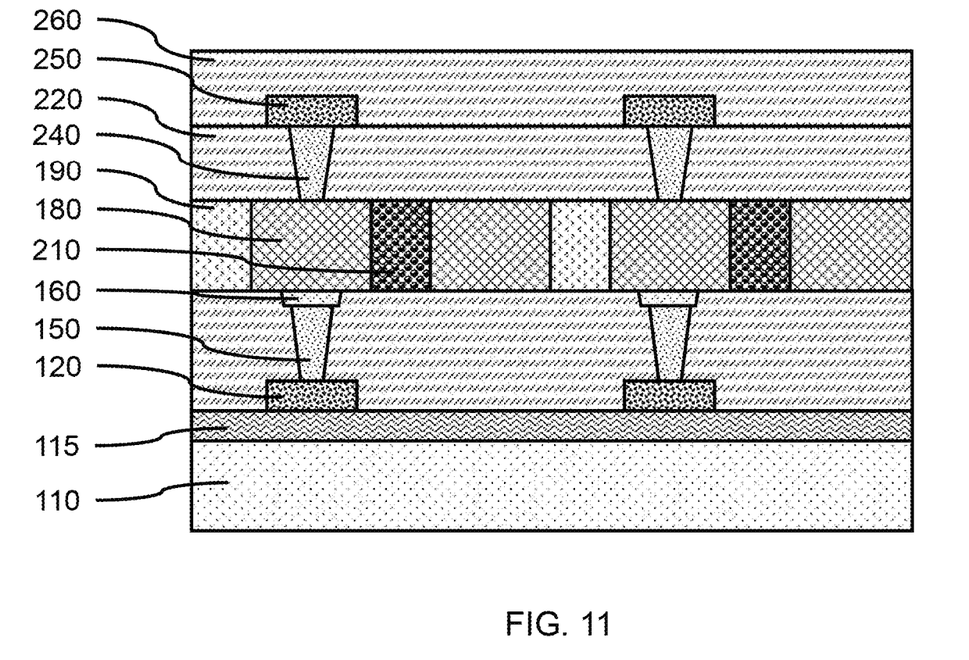
FIG. 11 is a cross-sectional side view showing an encapsulation layer on the upper conductive lines, in accordance with an embodiment of the present invention.

FIG. 11 is a cross-sectional side view showing an encapsulation layer on the upper conductive lines, in accordance with an embodiment of the present invention.

In one or more embodiments, an encapsulation layer 260 can be formed on the upper conductive lines 250 and upper insulating layer 220, where the encapsulation layer 260 can be formed by a blanket deposition. The encapsulation layer 260 can be an insulating dielectric material.

Figure 12:
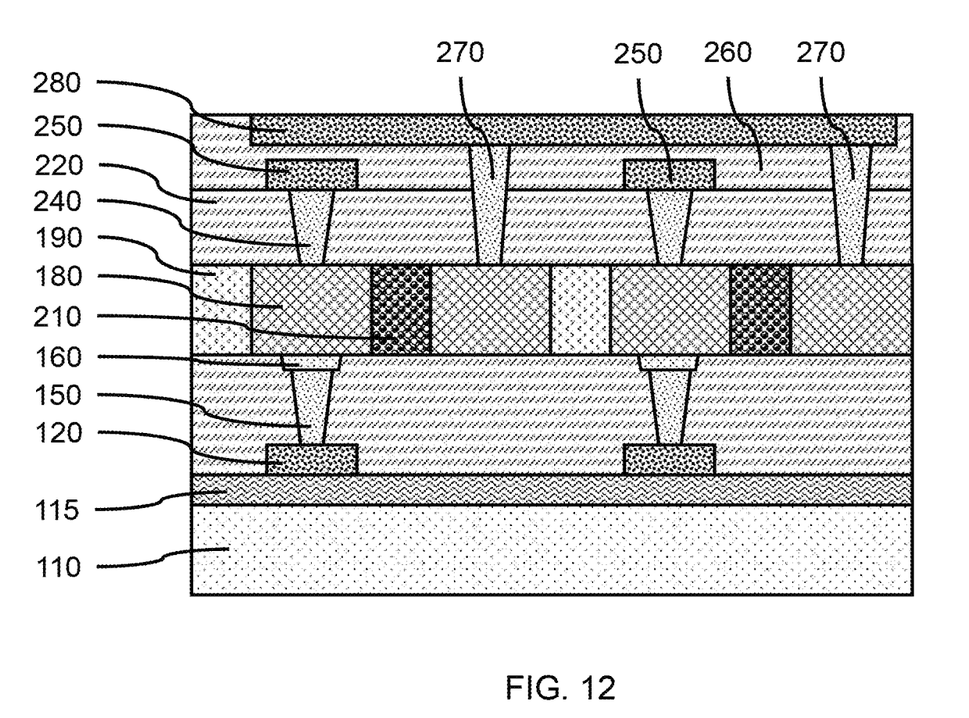
FIG. 12 is a cross-sectional side view showing word line trenches through the upper insulating layer and encapsulation layer to the intercalation layer segments with a conductive fill formed in each of the trenches, and a conductive line to the conductive fills, in accordance with an embodiment of the present invention.

FIG. 12 is a cross-sectional side view showing word line trenches through the upper insulating layer and encapsulation layer to the intercalation layer segments with a conductive fill formed in each of the trenches, and a conductive line to the conductive fills, in accordance with an embodiment of the present invention.

In one or more embodiments, word line trenches can be formed through the upper insulating layer 220 and encapsulation layer 260 to the intercalation layer segments 180 with a conductive fill formed in each of the word line trenches to form word line contacts 270. A conductive word line 280 can be formed on the encapsulation layer 260 to the word line contacts 270.

Figure 13:
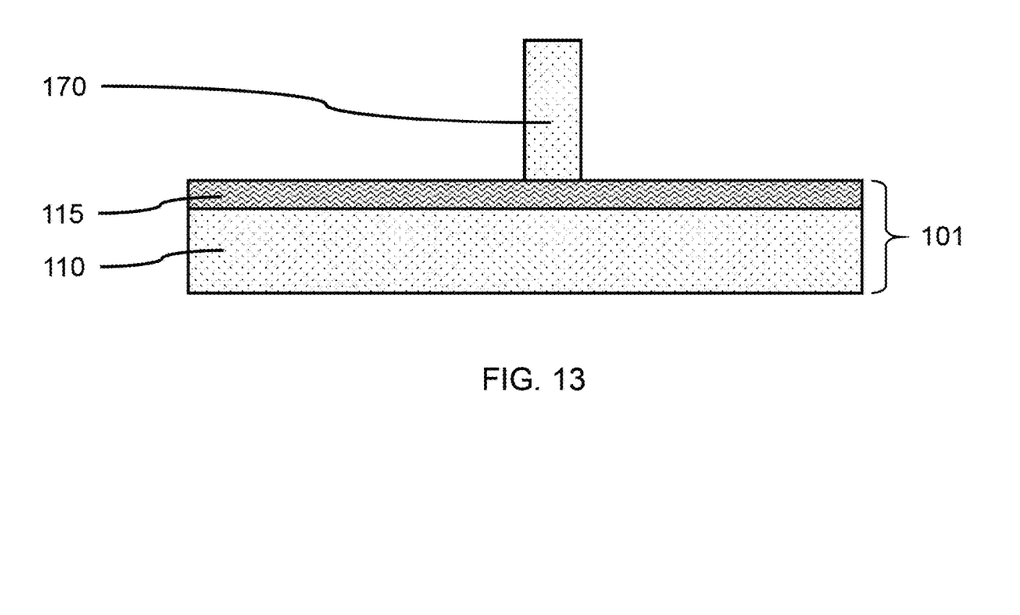
FIG. 13 is a cross-sectional side view showing a spacer on a substrate, in accordance with another embodiment of the present invention.

FIG. 13 is a cross-sectional side view showing a spacer on a substrate, in accordance with another embodiment of the present invention.

In one or more embodiments, one or more sacrificial spacer(s) 170 can be formed on an insulating region 115 of a substrate 101, where the spacer(s) 170 can be formed from the semiconductor layer of a semiconductor-on-insulator (SEOI) substrate.

Figure 14:
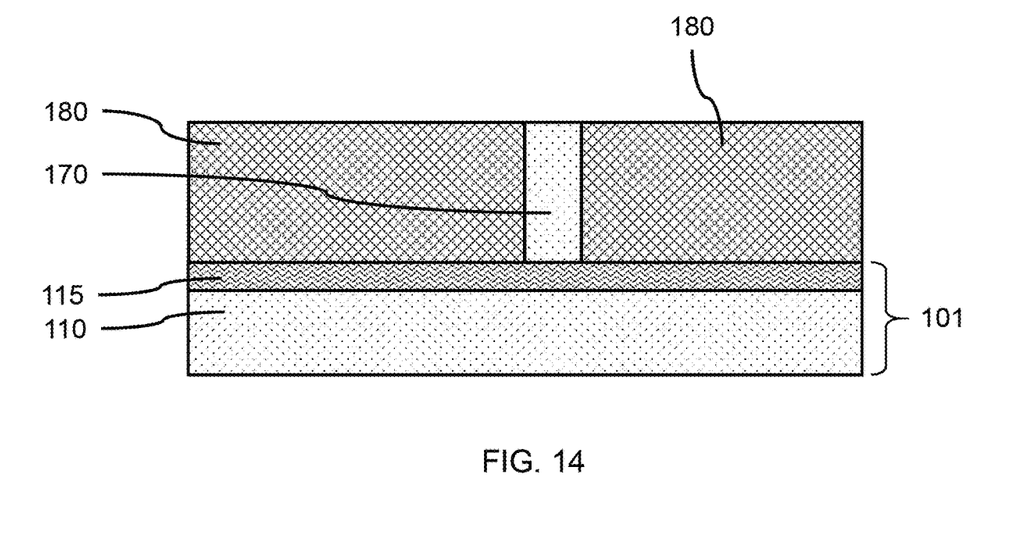
FIG. 14 is a cross-sectional side view showing intercalation layer segments formed on the substrate adjoining the spacer, in accordance with another embodiment of the present invention.

FIG. 14 is a cross-sectional side view showing intercalation layer segments formed on the substrate adjoining the spacer, in accordance with another embodiment of the present invention.

In one or more embodiments, intercalation layer segments 180 can be formed on the insulating region 115 of a substrate 101, where an intercalation layer segment 180 can be on each of opposite sides of the sacrificial spacer 170.

Figure 15:
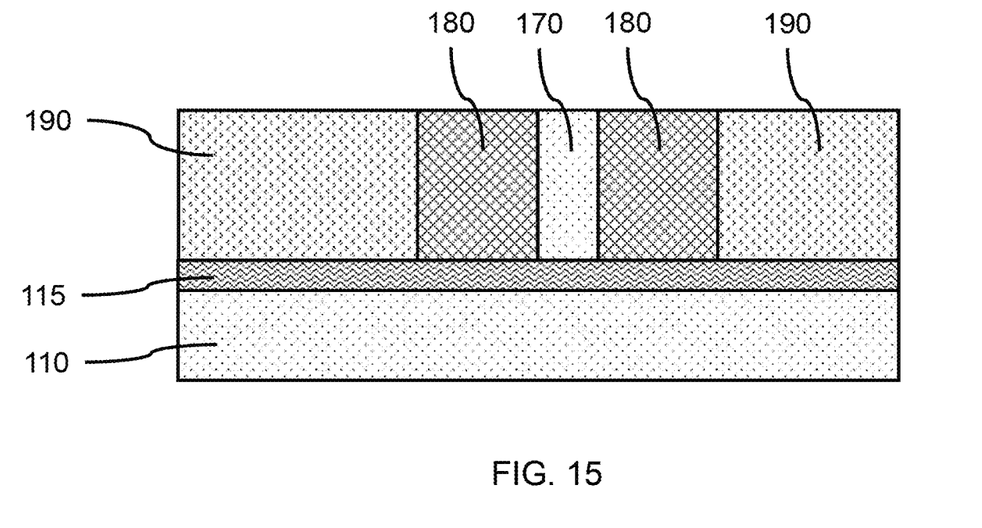
FIG. 15 is a cross-sectional side view showing portions of the intercalation layer segments replaced with isolation regions, in accordance with another embodiment of the present invention.

FIG. 15 is a cross-sectional side view showing portions of the intercalation layer segments replaced with isolation regions, in accordance with another embodiment of the present invention.

In one or more embodiments, portions of the intercalation layer segments 180 can be replaced with isolation regions 190.

Figure 16:
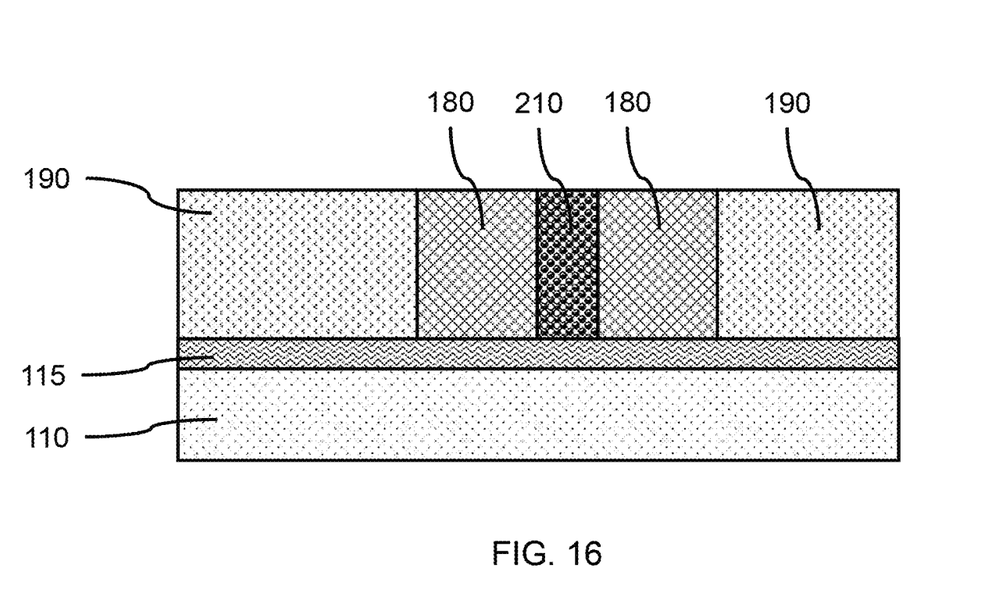
FIG. 16 is a cross-sectional side view showing the spacer replaced with an electrolyte layer, in accordance with another embodiment of the present invention.

FIG. 16 is a cross-sectional side view showing the spacer replaced with an electrolyte layer, in accordance with another embodiment of the present invention.

In one or more embodiments, the spacers 170 can be replaced with an electrolyte layer 210.

Figure 17:
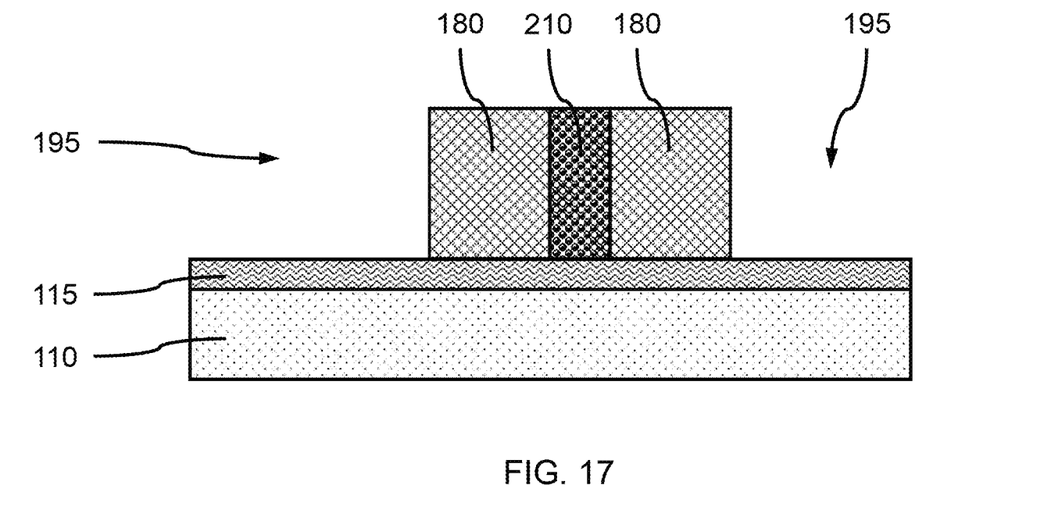
FIG. 17 is a cross-sectional side view showing the isolation regions removed to form gaps adjacent to the intercalation layer segments opposite the electrolyte layer, in accordance with another embodiment of the present invention.

FIG. 17 is a cross-sectional side view showing the isolation regions removed to form gaps adjacent to the intercalation layer segments opposite the electrolyte layer, in accordance with another embodiment of the present invention.

In one or more embodiments, the isolation regions 190 can be removed to form gaps 195 adjacent to the intercalation layer segments 180 opposite the electrolyte layer 210.

Figure 18:
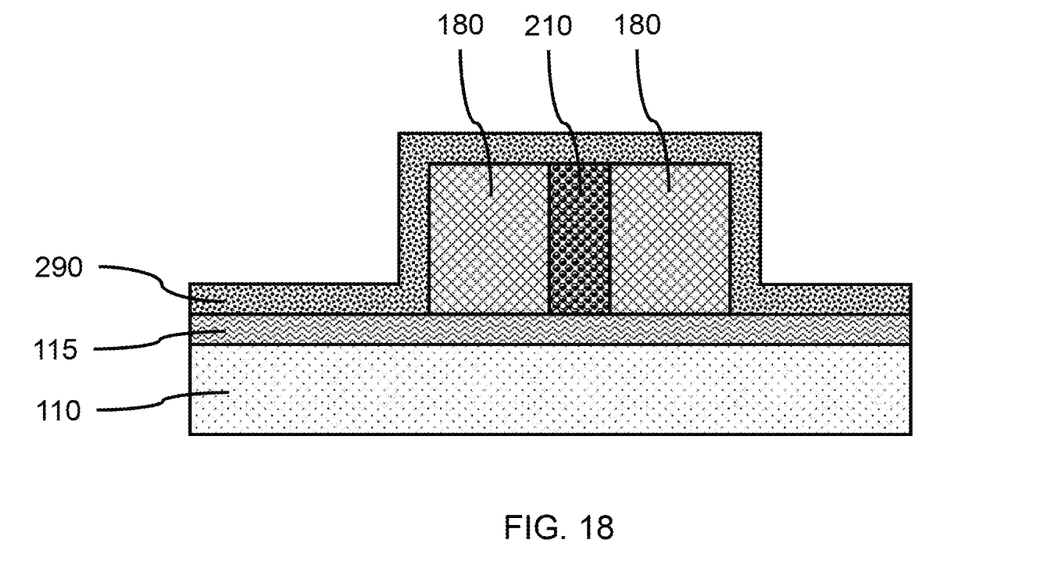
FIG. 18 is a cross-sectional side view showing a conducting junction layer formed in the gaps and on the intercalation layer segments, in accordance with another embodiment of the present invention.

FIG. 18 is a cross-sectional side view showing a conducting junction layer formed in the gaps and on the intercalation layer segments, in accordance with another embodiment of the present invention.

In one or more embodiments, a conducting junction layer 290 can be formed in the gaps 195 and on the intercalation layer segments 180, where the conducting junction layer 290 can be formed by a conformal deposition, for example, atomic layer deposition (ALD), plasma enhanced ALD (PEALD), low pressure CVD (LPCVD), or a combination thereof. The conducting junction layer 290 can cover the sidewalls of the intercalation layer segments 180.

In various embodiments, the conducting junction layer 290 can be a metal (e.g., tungsten (W), tantalum (Ta), ruthenium (Ru), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), tantalum magnesium carbide (TaMgC), carbon nanotubes (CNT), conductive carbon, graphene, or any suitable combination of these materials.

Figure 19:
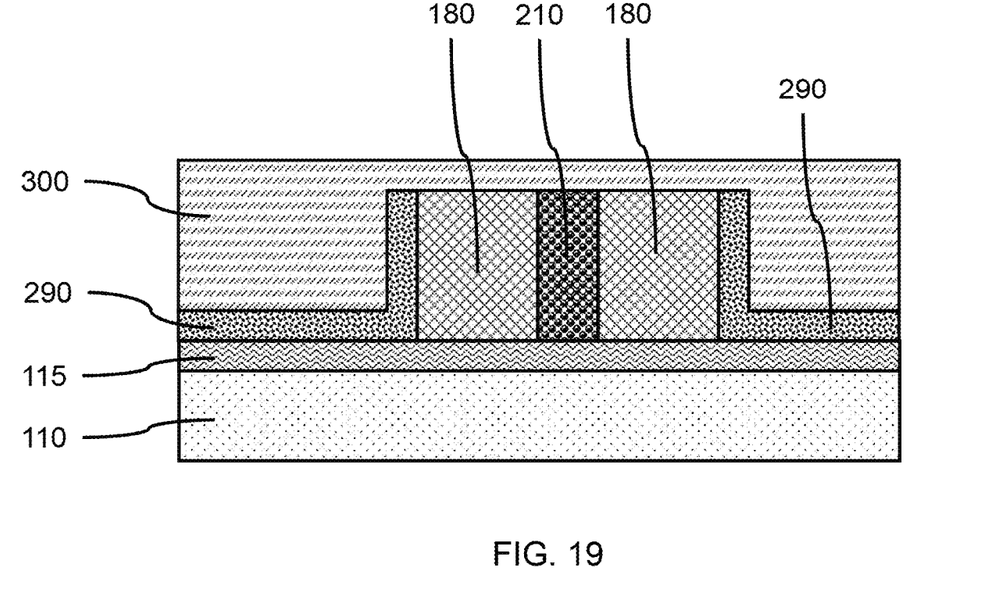
FIG. 19 is a cross-sectional side view showing a portion of the conducting junction layer removed from the top surface of the intercalation layer segments and electrolyte layer, in accordance with another embodiment of the present invention.

FIG. 19 is a cross-sectional side view showing a portion of the conducting junction layer removed from the top surface of the intercalation layer segments and electrolyte layer, in accordance with another embodiment of the present invention.

In one or more embodiments, a portion of the conducting junction layer 290 can be removed from the top surface of the intercalation layer segments 180 and electrolyte layer 210.

In various embodiments, an interlayer dielectric (ILD) layer 300 can be formed on the conducting junction layer 290, intercalation layer segments 180, and electrolyte layer 210, where the ILD layer 300 can be formed by a blanket deposition. The ILD layer 300 can be an insulating dielectric material.

Figure 20:
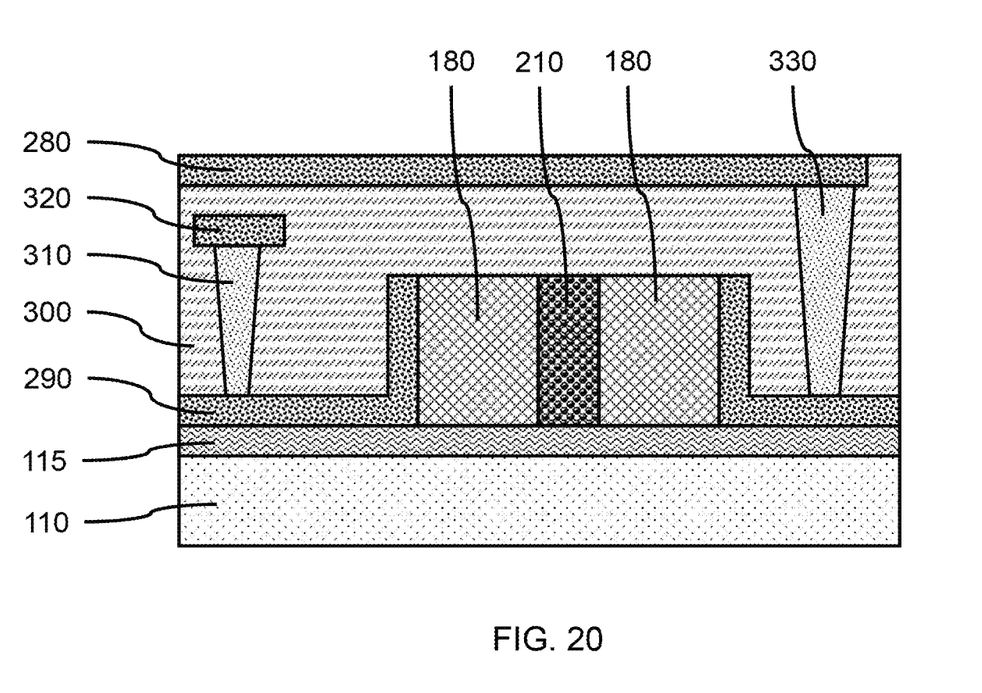
FIG. 20 is a cross-sectional side view showing a sense line contact and a word line contact formed to opposite sides of the conducting junction layer, in accordance with another embodiment of the present invention.

FIG. 20 is a cross-sectional side view showing a sense line contact and a word line contact formed to opposite sides of the conducting junction layer, in accordance with another embodiment of the present invention.

In one or more embodiments, a sense line via 310 can be formed through the ILD layer to the conducting junction layer 290 in electrical contact with the portion of the intercalation layer segments 180 on one side of the electrolyte layer 210, and a word line via 330 can be formed through the ILD layer 300 to the conducting junction layer 290 in electrical contact with the portion of the intercalation layer segments 180 on the opposite side of the electrolyte layer 210 forming the electrochemical device channel. A conductive sense line 320 can be formed to the sense line via 310. A conductive word line 280 can be formed on the ILD layer 300 to the word line via 330.

In various embodiments, a conductive bit line (not shown) can be formed to a bit line via (not shown) behind the plane of the conductive sense line 320 and the sense line via 310, so two electrical contacts are formed to the same intercalation layer segment 180 to form source/drain contacts of a device.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower" "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation addition to the orientation depicted in the FIGS. For example, if the device in the FIGS. is turned over, elements described as "below" or "beneath" other elements or features would then be oriented "above" the other e rets or features. Thus, the term "below" can encompass both an ion of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a resistive processing unit, comprising:
    forming a spacer on a substrate;
    forming an intercalation layer segment on opposite sides of the spacer;
    replacing a portion of each of the intercalation layer segments with an insulating region; and
    replacing the spacer with an electrolyte layer.

2. The method of claim 1, further comprising forming an upper insulating layer on the electrolyte layer and intercalation layer segments.

3. The method of claim 2, further comprising forming an upper trench to each of the intercalation layer segments in the upper insulating layer, and forming a conductive fill in each of the upper trenches.

4. The method of claim 1, further comprising removing the insulating regions to form gaps adjoining each of the intercalation layer segments.

5. The method of claim 4, further comprising forming a conducting junction layer in the gaps and on the intercalation layer segments.

6. The method of claim 5, further comprising forming an interlayer dielectric (ILD) layer on the conducting junction layer, intercalation layer segments, and electrolyte layer.

7. The method of claim 1, wherein the intercalation layer segments include a metal oxide material that undergoes a change in resistivity based on an amount of an intercalant.

8. The method of claim 7, wherein the electrolyte layer is a solid electrolyte selected from the group consisting of LiPON, LiZrPO, $Li_2S$, and sulfonated tetrafluoroethylene based fluoropolymer-copolymers.

9. The method of claim 8, wherein the intercalant is selected from the group consisting of hydrogen (H), lithium (Li), sodium (Na), calcium (Ca), and combinations thereof.

10. A method of forming a resistive processing unit, comprising:
   forming a plurality of lower conductive lines on an insulating region;
   forming a lower insulating layer over the plurality of lower conductive lines;
   forming a via to each of the plurality of lower conductive lines;
   forming a plurality of spacers on the lower insulating layer, wherein each of the plurality of spacers is offset from one of the vias;
   forming intercalation layer segments on the insulating layer; wherein the intercalation layer segments are on opposite sides of each of the plurality of spacers;
   replacing a portion of each intercalation layer segments with an insulating region; and
   replacing each of the plurality of spacers with an electrolyte layer.

11. The method of claim 10, further comprising heat treating the intercalation layer segments at a temperature in a range of about 200° C. to about 700° C.

12. The method of claim 11, wherein the intercalation layer segments include a metal oxide material that undergoes a change in resistivity based on an amount of an intercalant.

13. The method of claim 11, further comprising forming an upper insulating layer on the electrolyte layer and intercalation layer segments.

14. The method of claim 13, further comprising forming an upper trench to each of the intercalation layer segments in the upper insulating layer, and forming a conductive fill in each of the upper trenches, wherein each of the conductive fill in each of the upper trenches is in electrical contact with the same intercalation layer segment as the via.

* * * * *